United States Patent [19]

Hoskins et al.

[11] Patent Number: 5,377,307
[45] Date of Patent: Dec. 27, 1994

[54] SYSTEM AND METHOD OF GLOBAL OPTIMIZATION USING ARTIFICIAL NEURAL NETWORKS

[75] Inventors: Josiah C. Hoskins; Glenn A. Kramer, both of Austin, Tex.

[73] Assignee: Schlumberger Technology Corporation, Austin, Tex.

[21] Appl. No.: 957,565

[22] Filed: Oct. 7, 1992

[51] Int. Cl.$^5$ ............................................. G06F 15/18
[52] U.S. Cl. ........................................ 395/22; 395/23; 395/24
[58] Field of Search ..................... 395/22, 23; 364/578, 364/576

[56] References Cited

U.S. PATENT DOCUMENTS

| | | | |
|---|---|---|---|
| 4,633,411 | 12/1986 | Bliss et al. | 364/576 |
| 4,747,143 | 5/1988 | Kroeger et al. | 395/2.35 |
| 4,990,838 | 2/1991 | Kawato et al. | 395/23 |
| 5,043,929 | 8/1991 | Kramer et al. | 364/578 |
| 5,050,096 | 9/1991 | Seidman | 395/22 |
| 5,057,992 | 10/1991 | Traiger | 364/148 |
| 5,107,442 | 4/1992 | Weideman | 395/11 |
| 5,113,483 | 5/1992 | Keeler et al. | 395/23 |
| 5,119,468 | 6/1992 | Owens | 395/22 |
| 5,129,040 | 7/1992 | Hanazato et al. | 395/25 |
| 5,134,685 | 7/1992 | Rosenbluth | 395/21.23 |

OTHER PUBLICATIONS

Neural Networks for Learning Inverse-Kinematics of Redundant Manipulators 14–16 Aug. 1989 IEEE, F. Pourboghrat.
6D.O.F. Manipulators Absolute Positioning Accuracy Improvement Using a Neural Network IEEE, 3–6 Jul. 1990 N–Takanashi.
Solution to the Inverse Kinematics Problem in Robotics by Neural Networks IEEE, 24–27 Jul. 1988 A. Guez.
Automatic Translation of Constraints for Solving Optimization Problems by Neural Networks IEEE 17–21 Jun. 1990 C. Gaspin.
An Adaptive Least Squares Algorithm to the Efficient Training of Artificial Neural Networks IEEE/Aug. 8, 1989 S. Kollas et al.

*Primary Examiner*—Allen R. MacDonald
*Assistant Examiner*—Richemond Dorvil
*Attorney, Agent, or Firm*—Charles D. Huston

[57] ABSTRACT

A method of global optimization of complex, highly nonlinear, multivariant systems is described. An artificial neural network (ANN) is trained to create an approximate inverse model. The desired behavior for a particular system is then input to the inverse model to derive approximate model parameters for the particular system. Optimization of the approximate model parameters yields optimal model parameters. The method is applied to the synthesis of mechanical linkages where examples of a type of linkage mechanism are used to train an ANN and derive the approximate inverse model. Inverse models for a number of linkage mechanism types are derived and stored. For a linkage mechanism with unknown linkage parameters, a power spectrum representation of the coupler curve is developed and the inverse model for the type of linkage mechanism retrieved. The representation of the desired coupler curve is input and the approximate linkage parameters derived. Optimization further refines the linkage parameters.

15 Claims, 12 Drawing Sheets

SYSTEM AND METHOD OF GLOBAL OPTIMIZATION USING ARTIFICIAL NEURAL NETWORKS

TECHNICAL FIELD

The present invention relates generally to global optimization in multi-dimensional, highly nonlinear systems using artificial neural networks (ANNs) in conjunction with local optimization techniques. In particular, a system and method are described for determining optimal model parameters given a desired behavior. An exemplar system and method are described for determining linkage parameters for a linkage mechanism given a desired behavior.

BACKGROUND OF THE INVENTION

The problem of global optimization in multi-dimensional, highly nonlinear systems is a difficult and challenging task. The objective function may exhibit many local optima whereas the global optimum is sought. A solution to the optimization problem may be obtained that is less satisfactory than another solution elsewhere in the region. The better solution may be reached by initiating the search for the optimum from a starting point closer to the global optimum.

Representing and utilizing knowledge for design synthesis is a type of global optimization problem. In some domains, structured design synthesis techniques can generate designs automatically from functional specifications. But in many domains, these techniques are not practical and/or possible. For example, mechanical devices may have equations of motion that are complex, highly nonlinear, and difficult to comprehend, thwarting structured design methodologies. In such domains, a designer often proceeds by building and/or simulating devices, analyzing these designs, and gaining intuition about the device behavior over the course of many design modifications.

1. Mechanical Linkages

Mechanical linkages are collections of rigid bodies connected by joints that allow restricted relative movement. They are found in a variety of everyday objects. Some examples are: the hinge for an automobile hood, an automobile suspension, aircraft landing gear, cranes, and bicycle derailleurs. The general problem is described in U.S. Pat. No. 5,043,929 (incorporated by reference).

The simplest mechanical linkage is the four-bar, planar linkage shown in FIG. 3. One link, called ground, serves as the reference frame for describing all relative movement. The other three links are called the crank, coupler, and follower. The crank and follower are attached to the ground link, and rotate about it on revolute joints. The other ends of the crank and follower are constrained to move relative to each other via the coupler link, which is the source of the nonlinearity in the four-bar's behavior. The tracer point is a point rigidly attached to the coupler. The path in space traced by the tracer point is called the coupler curve. These are closed curves; FIG. 3 shows only a portion of the coupler curve. FIG. 4 illustrates a coupler curve.

Linkages are used for three main purposes: path, motion, and function generation. See, Sandor, G. N. and A. G. Erdman. *Advanced Mechanism Design: Analysis and Synthesis*, Volume 2, Prentice-Hall, Inc., Englewood Cliffs, N.J. (1984). In path generation, the linkage is used to guide an object through space; no attention is given to the object's orientation. Motion generation is similar to path generation, but the orientation of the object is also controlled. In function generation, the nonlinear behavior of the linkage is utilized to approximate a desired functional relationship between the input and output cranks of the mechanism.

Analytic methods for linkage synthesis are based on the work of Burmester, see, Burmester, L. *Lehrbuch tier Kinematic. A. Felix, Leipzig* (1888), which involved graphical analysis of finite displacements of rigid-body planar linkages. This work, which handles a subset of purely analytic, exactly-constrained design problems, was later analyzed in the context of algebraic geometry and translated into computer programs. See, Erdman, A. G. Computer-aided design of mechanisms: 1984 and beyond. *Mechanism and Machine Theory*, 20:4,245-249 (1985).

Some techniques have been developed to handle overconstrained synthesis problems. Chebychev polynomials were developed specifically for kinematic synthesis and provide a good approximate fit to the overconstrained problem. See, Sarkisyan, Y. L., Gupta, K. C. and B. Roth. Chebychev approximations of finite point sets with application to planar kinematic synthesis. *Journal of Mechanical Design, Trans. ASME*, 101:1.32–40 (January 1979). A similar least-squares approach is found in Sutherland, G. H. and B. Roth. An improved least-squares method for designing function-generating mechanisms. *Journal of Engineering for Industry, Trans. ASME Ser. B*, 97:1,303–307 (February 1975).

Because of the limitations of algorithmic design methodologies, iterative design is commonplace among practicing engineers. Iterative synthesis describes a process in which the design is analyzed to determine how well it meets the design specification. If the behavior matches specification well enough, the design is complete; otherwise, some design variables (dimensions) are modified in order to make the behavior more closely match the specification, and the process is repeated. This style of design relies heavily upon the designer's experience, particularly in the initial selection of a mechanism.

Choosing design parameters requires an inverse model of behavior of the device; when such models are unavailable, designers must rely on experience. One way for a designer to overcome a lack of experience is to make use of past similar designs, by choosing a mechanism from a catalog. See, Artobolevsky, I. *Mechanisms in Modern Engineering Design*. USSR Academy of Sciences, Moscow, (1947–1952). Translated and reprinted by Mir Publishers, Moscow (1975). In the microcosm of four-bar linkages, the Hrones and Nelson atlas of four-bar coupler curves provides over 7300 different examples of four-bar crank and rocker mechanisms, along with guidelines for analysis and for synthesis of more complex linkages built upon the four-bar. See, Hrones, J. A. and G. L. Nelson. *Analysis of the Four-bar Linkage*. The Technology Press of MIT and John Wiley & Sons, Inc., New York (1951). However, finding an appropriate coupler curve in the catalog can be difficult.

The utility of design catalogs in the synthesis of linkages can be improved by automating the process of searching the catalog and retrieving appropriate past designs. Once such technique is described in Kramer, G. A. and H. G. Barrow. A case-based approach to the design of mechanical linkages. In *Artificial Intelligence*

*in Engineering Design*, 2, 443–466, Academic Press, San Diego, Calif. (1992) and U.S. Pat. No. 5,043,929. However, the size of the catalog can be very large, and automated search is time-consuming. Furthermore, no interpolation between catalog entries is done.

2. Artificial Neural Networks

A great deal of recent research has been published relating to the application of artificial neural networks in a variety of contexts. See, for example, U.S. Pat. Nos. 5,134,685, 5,129,040, 5,113,483, and 5,107,442 (incorporated by reference). Artificial neural networks are computational models inspired by the architecture of the human brain. As a result three constraints are usually imposed on these models. The computations must be performed in parallel, the representation must be distributed, and the adjustment of network parameters (i.e., learning) must be adaptive. From an engineering perspective ANNs are adaptive, model-free estimators that estimate numerical functions using example data. While many different types of artificial neural networks exist, two common types are radial basis function (RBF) and back propagation artificial neural networks.

Radial basis function ANNs have the capability to synthesize an approximation to a multivariant function (or its inverse) by using a representative set of examples characteristic of the functions input-output mapping.

RBF ANNs are single hidden-layer, feedforward networks that use radially-symmetric basis functions as the activation functions for nodes in the hidden layer. The approximation learned by the RBF ANN is given by $$f_k(x) = \sum_j w_{kj} R_j(x) \quad (1)$$

where $R_j$ is a radially-symmetric basis function, x is the input vector, and $w_{kj}$ is the weight connecting the jth hidden node to the kth output node.

Typically, the basis function R for node j is the Gaussian function with unit normalization:

$$R_j(x) = e^{(-\|x-x_j\|^2/\sigma_j^2)} \quad (2)$$

Equation (2) indicates that the output for node j peaks with a value of unity when the input vector equals the mean vector, $x_j$, and falls off monotonically as the Euclidean norm between input and the mean vector of a node increases. $\sigma_j$, the width of the response field of the basis function, determines the rate of decay of the Gaussian function R.

The nonpatent references cited herein are incorporated by reference for background.

SUMMARY OF THE INVENTION

The problems outlined above are generally solved by the system and method of the present invention. That is, the present method introduces artificial neural networks in combination with optimization techniques to solve difficult inverse modeling problems, particularly useful for complex, highly nonlinear, multivariant systems. The present invention preferably uses a radial basis function artificial neural network, a good global nonlinear approximator, to learn an approximate inverse model that maps the power spectrum of a user-specified behavior to the model parameters. Once the approximate model parameters have been obtained, a local optimization technique is used to "fine tune" the solution.

Broadly speaking, the system and method of global optimization of the present invention develops an approximate inverse model of a system using an artificial neural network (ANN), determines the approximate model parameters of the system given the desired system behavior, and obtains the optimal model parameters using a local optimization process. To develop the approximate inverse model of the system a forward model is constructed with model parameters as inputs and behaviors as outputs to build a set of training examples. An ANN is developed using the training examples to build the inverse model, which produces approximate model parameters given behaviors. Preferably, an inverse model is built for a particular type of system, and one or more inverse models stored for later reuse. Once the inverse model for a system is developed, the approximate model parameters are determined by retrieving the appropriate inverse model and computing the approximate model parameters given the desired system behavior as inputs.

The approximate model parameters can be optimized using the forward model and a local optimization process. Preferably, the optimization process is an iterative process with the constraints of the system imposed as penalty functions; e.g. a Levenberg-Marquardt type of optimization. As used herein the term "local optimization" is not intended to exclude any known optimization techniques. In the preferred embodiment "local optimization" refers to techniques known to work well in limited or local regions of a system, such as an iterative process.

The synthesis of the mechanical linkages is a good example of the application of the system and method of the present invention. In this domain, even the simplest curves are of high polynomial degree in the relationship between curve shape and the mechanisms link length. Generally speaking, the method of determining the mechanical linkage parameters for a linkage mechanism includes providing a number of examples of the linkage mechanism in question to train an artificial neural network and building an inverse model of the mechanism as a function of the linkage parameters. The representation of the desired behavior of the linkage mechanism is input to the inverse model to compute the approximate linkage parameters. The approximate linkage parameters can be further refined using a local optimization technique. A number of different inverse models of mechanisms can be developed and stored. When a linkage mechanism is under review, the corresponding inverse model for the type of mechanism is retrieved from memory and used by the designer who inputs the desired behavior of the mechanism.

A designer might specify a particular coupler curve (i.e. desired behavior of the mechanism) for a type of mechanical linkage mechanism. The present invention utilizes a representation of the coupler curve by plotting the curvature versus curve perimeter length. Unfortunately, the curvature plot contains an arbitrary phase offset, so each coupler curve can be represented by an infinite number of curvature plots. The present invention utilizes the power spectrum Fourier transform of the curvature plot as the behavior representation input to the inverse model to avoid this arbitrary phase offset and provide a degree of uniqueness.

This method of constructing a representation can be applied to many domains for obtaining some mapping uniqueness and avoiding phase offset and is particularly useful in conjunction with artificial neural networks.

DESCRIPTION OF THE PREFERRED EMBODIMENT

Figure 1:
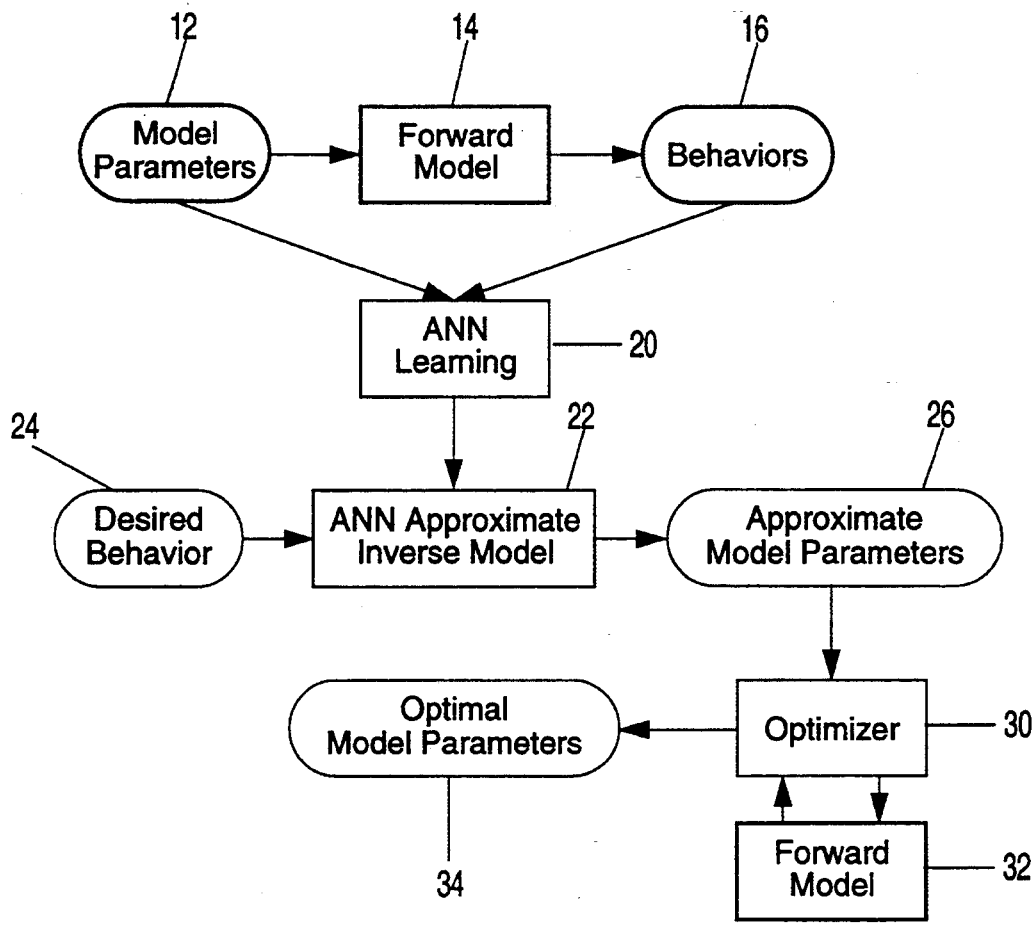
FIG. 1 is a flow chart depicting the global optimization method of the present invention.
Figure 2:
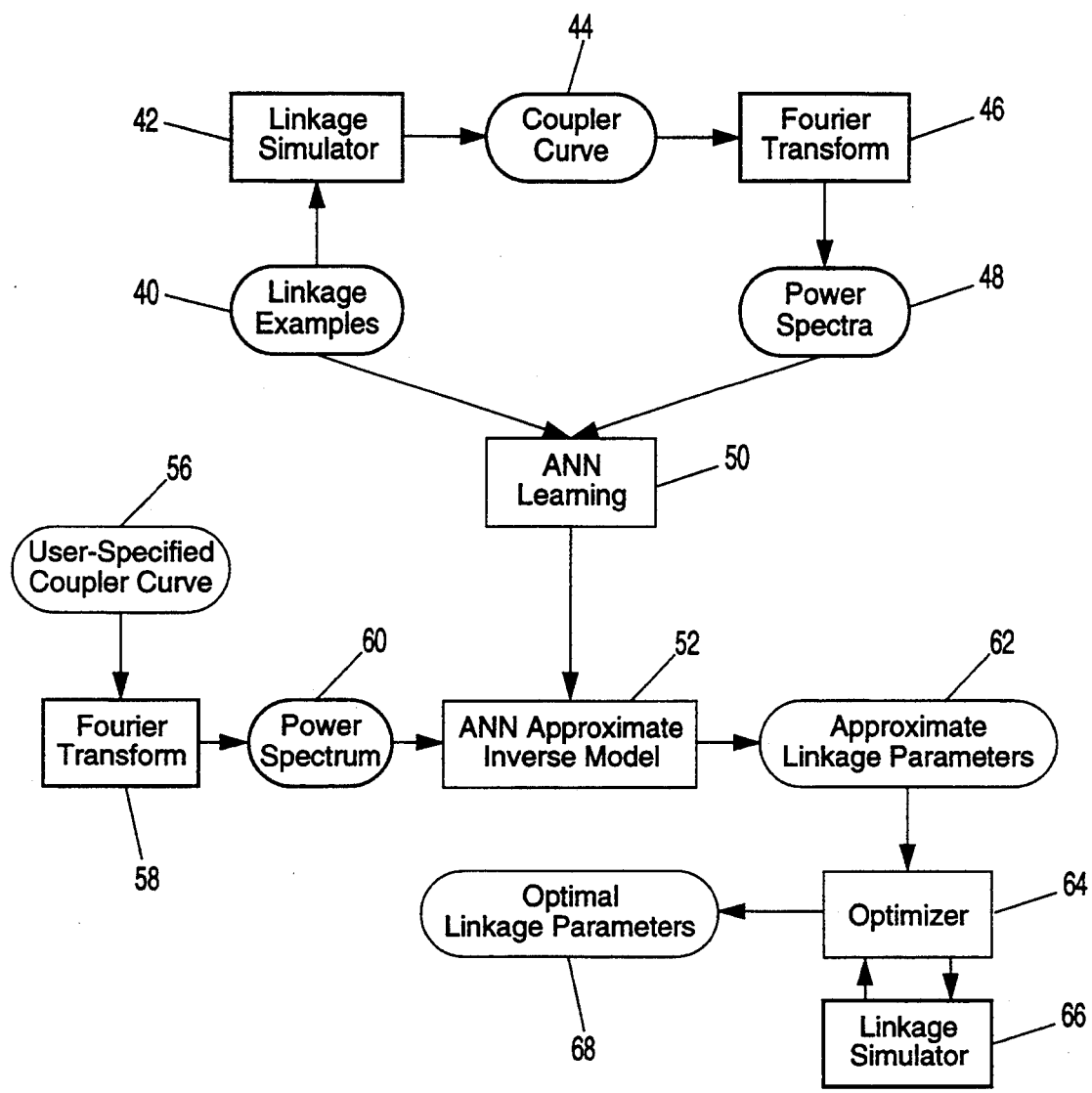
FIG. 2 is a flow chart describing the process for deriving optimal linkage parameters for a linkage mechanism using the method of the present invention.

Referring to the drawings, FIG. 1 illustrates a generalization of the global optimization process of the present invention while FIG. 2 illustrates the global optimization process applied to a mechanical linkage design problem. In FIG. 1, several subprocesses occur sequentially. First, the training set for the artificial neural network must be built (12, 14, 16). To build the training set a forward model 14 takes model parameters 12 and builds behaviors 16. The forward model 14 may be, but does not have to be, an artificial neural network.

The next subprocess is to build an approximate inverse model. As seen in FIG. 1, the model parameters 12 and behaviors 16 are used as the training set in the ANN learning process 20 to build the ANN approximate inverse model 22.

The next subprocess uses the inverse model 22 to derive approximate model parameters 26. As seen in FIG. 1, a user inputs the desired behavior 24 of the system to the inverse model 22 and the inverse model outputs the approximate model parameters 26. A desired behavior 24 may be input directly or a representation of the behavior used. The object of the inverse modeling is to provide approximate model parameters which will be "close" enough for local optimization techniques to converge to optimal model parameters. That is, the inverse modeling seeks to avoid local minima which might preclude convergence in a system with local optimization techniques.

Having derived the approximate model parameters, any local optimization technique can now be applied as at 30 to derive the optimal model parameters 34 of the system. Preferably, the forward model 32 is similar or identical to the forward model 14 and can be used in the optimization process.

Figure 3:
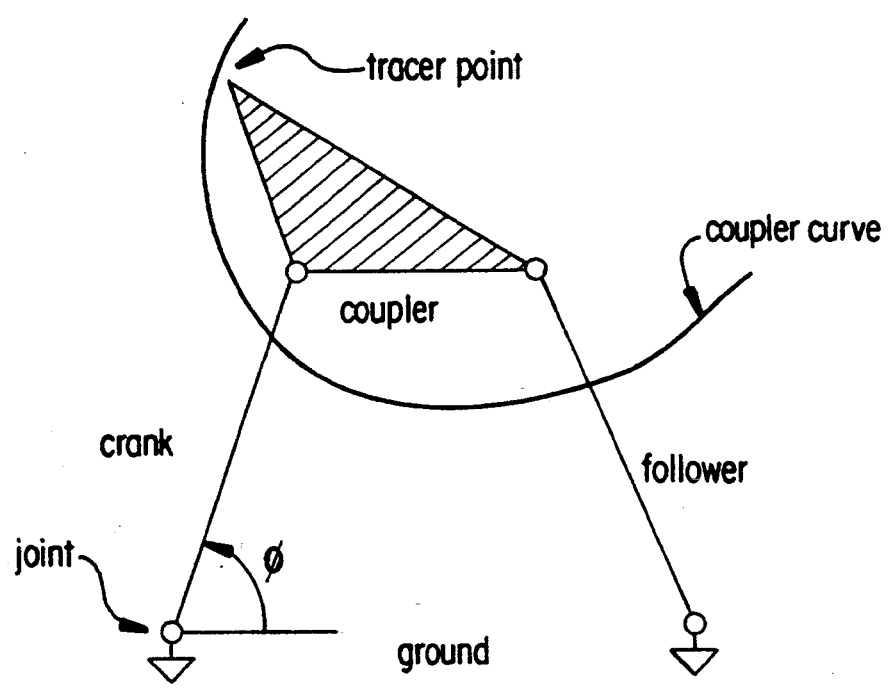
FIG. 3 is a schematic depicting a four bar mechanical linkage mechanism.

The present invention is illustrated in the context of a mechanical design problem, specifically the design of a mechanical linkage. In the mechanical linkage problem, the designer seeks to determine a suitable set of linkage parameters, such as lengths of the links, knowing the desired behavior of the linkage mechanism. Typically the desired behavior is a coupler curve (FIG. 4) which depicts the position of a tracer point on the linkage in space as the linkage mechanism is moved (FIG. 3).

1. Representation

Unfortunately, the space of possible linkages is unbounded and infinite. Linkages may have any position and orientation in space, and can be any size. Thus, the representation used must be chosen carefully so that the entire "reasonable" space of mechanisms is represented and spanned with a tractable number of samples.

Figure 4:
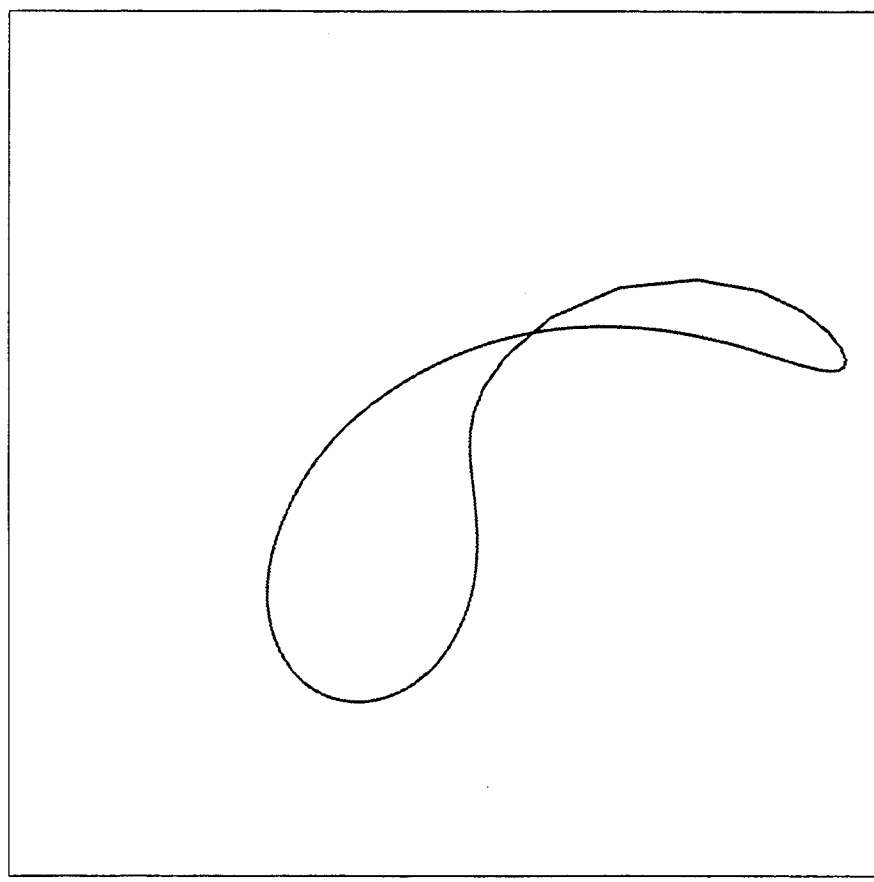
FIG. 4 illustrates a coupler curve used in the process of FIG. 2.
Figure 6:
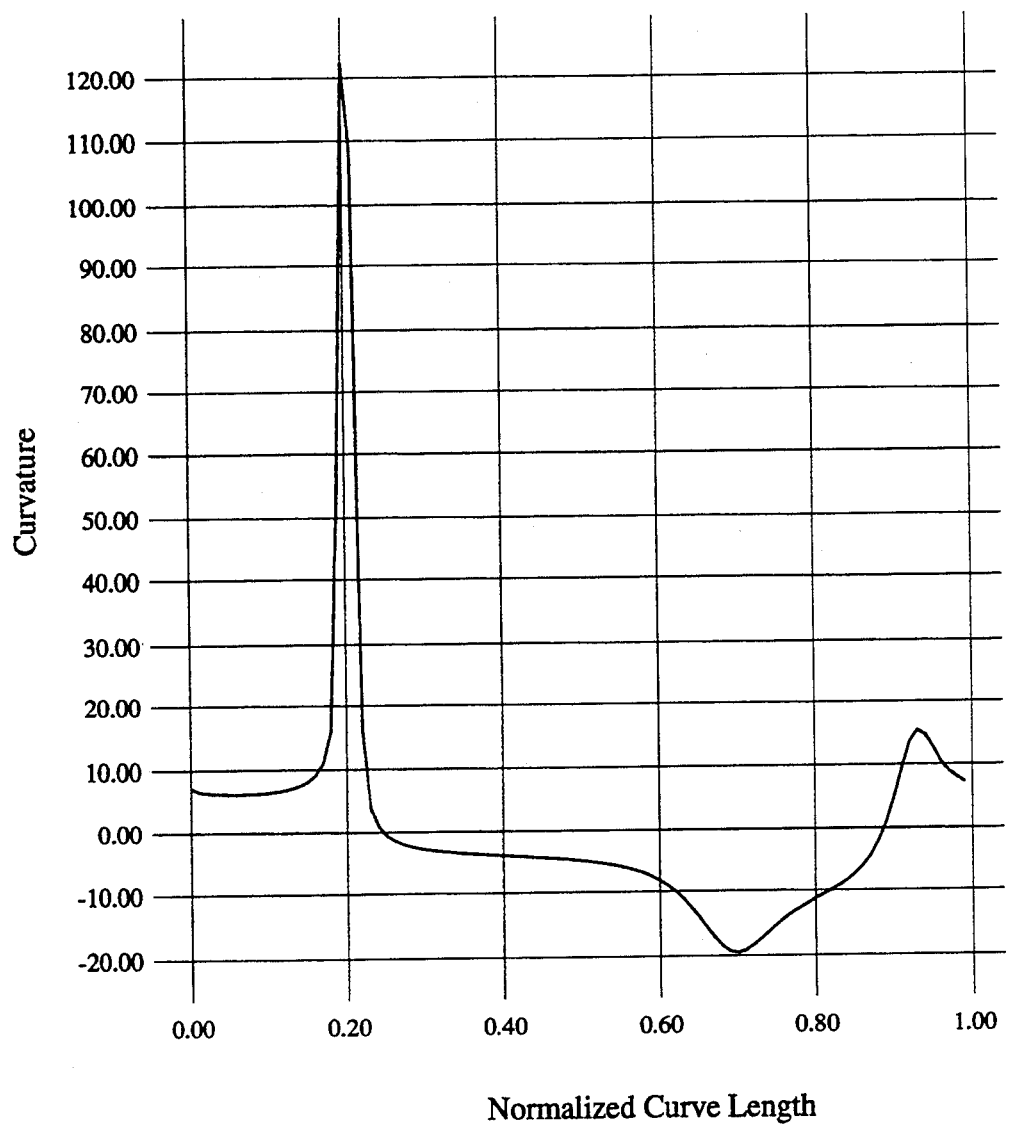
FIG. 6 is a representation of the coupler curve of FIG. 4, plotting curvature against curve perimeter length.

A representation based on the curvature of the coupler curve removes the dependence of the representation on translation, orientation, and scale of the linkage. A given curve may be positioned and scaled to fit the problem after it is synthesized in some "normal" form. Four variables are eliminated from the representation by fixing the ground link at unity (thus fixing the scale), and using curvature to remove dependence on position and orientation. Bounds on the crank, coupler, and follower links can be set by good engineering practice; the ratios of the lengths of the links in a mechanism should not exceed a factor of ten, in order to keep the design robust. See e.g., Kramer, G. A. and H. G. Barrow. A case-based approach to the design of mechanical linkages. In *Artificial Intelligence in Engineering Design*, 2, 443–466, Academic Press, San Diego, Calif. (1992). A plot of the curvature of the coupler curve of FIG. 4 is shown in FIG. 6. The curvature is a cyclic representation, with no unique starting point on the graph.

Since the curvature plot of FIG. 6 contains an arbitrary phase offset, each coupler curve can be represented by an infinite number of curvature plots. For this reason, the present invention uses the power spectrum of the Fourier transform of the curvature plots. Although the real and imaginary pans of the Fourier transform vary with the phase offset of the curvature plot, the power spectrum shown in FIG. 7 (defined as the sum of the squares of the real and imaginary parts of the Fourier transform at each point) does not. In theory, there are multiple curves with the same power spectrum which are not phase shifted versions of each other. However, with the portion of the space explored at present, uniqueness of the power spectrum representation in the mechanical linkage domain appears feasible.

2. ANN Storage and Retrieval

Artificial Neural Networks offer a new approach to design catalogs, where design instances are not specifically stored, but are used to form an approximate inverse to the function describing the behavior of the mechanism.

Figure 5:
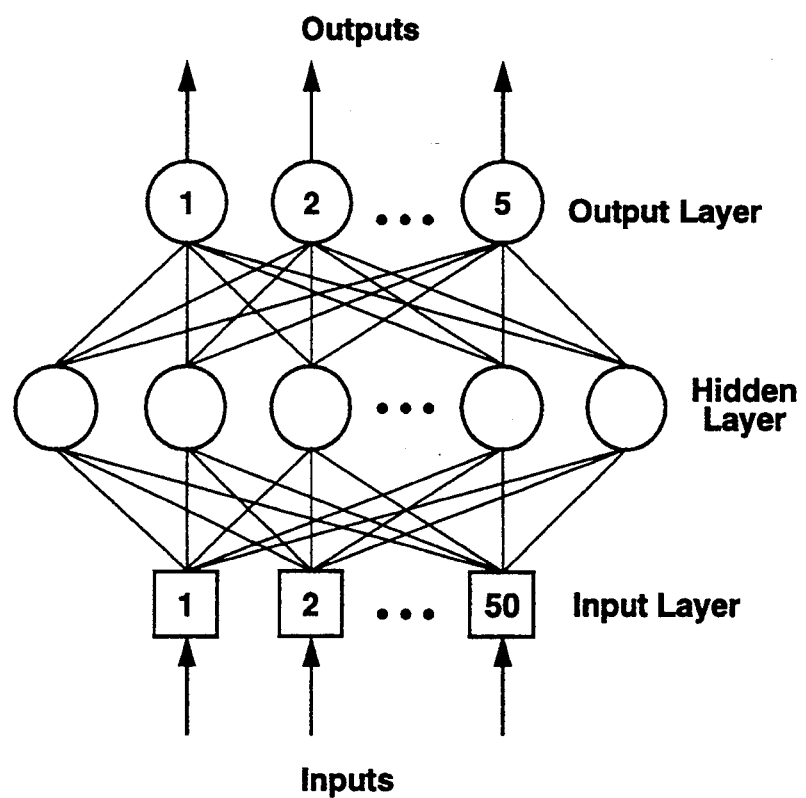
FIG. 5 Schematically depicts a radial basis function (RBF) artificial neural network (ANN) with 5 output nodes and 50 input nodes for use with four bar mechanical linkage problem.

The preferred embodiment stores and retrieves applicable linkage designs using a Radial Basis Function (RBF) ANN, FIG. 5. See, Broomhead, D. S., and D. Lowe. Multivariate Functional Interpolation and Adaptive Networks. *Complex Systems* 2, 321–355 (1988); Moody, J. and C. J. Darken. Fast Learning in Networks of Locally-Tuned Processing Units. *Neural Computation* 1, 281–294 (1989); and Poggio, T. and F. Girosi. *A theory of networks for approximation and learning.* Technical Report A.I. Memo No. 1140, Massachusetts Institute of Technology (1989), incorporated for background. Any ANN that performs functional approximation (interpolation or extrapolation) may be used, such as any multilayer feedforward ANN's. RBF ANNs have the capability to synthesize an approximation to a multivariate function (or its inverse) by using a representative set of examples characteristic of the function's input-output mapping. Thus, by learning a representative set of examples taken from the mapping of a curve's power spectrum to its corresponding linkage parameters the preferred embodiment builds an approximation of the inverse of the function describing the behavior of the mechanism as a function of its dimensions.

The preferred embodiment uses a three-stage hybrid learning procedure to adjust the network parameters. First, the mean vectors of the RBF nodes are found using the K-means clustering algorithm. See, Späth, H. *Cluster Analysis Algorithms*. Ellis Harwood, Chichester, UK (1980) (incorporated for background). Second, the width of each basis function is set to the distance from its mean vector to the mean vector of the nearest basis function. To achieve overlap between each basis function and its immediate neighbors, the nearest neighbor distance, $d_{NN}$, is multiplied by an overlap factor in order to form a smooth, contiguous interpolation over the input space. Third, the weights on the connections between the RBF layer and the output layer are adjusted using the closed form least squares solution, Singular Value Decomposition. See, Press, W., Flannery, B., Teukolsky, S. and W. Vetterling. *Numerical Recipes in C: The Art of Scientific Computing*. Cambridge, Cambridge University Press (1988) (incorporated for background).

3. Global Optimization local optimization follows the gradient of a function downward toward a minimum, or optimum, of the function. This optimum may not be the globally lowest value of the function; it may be a local optimum.

Global optimization may be accomplished by using gradient-based optimization techniques on a variety of starting points, and choosing the smallest local optimum from all the local optima found. If nothing is known about the function, a large number of points must be tried to ensure that the global optimum is found.

Figure 11:
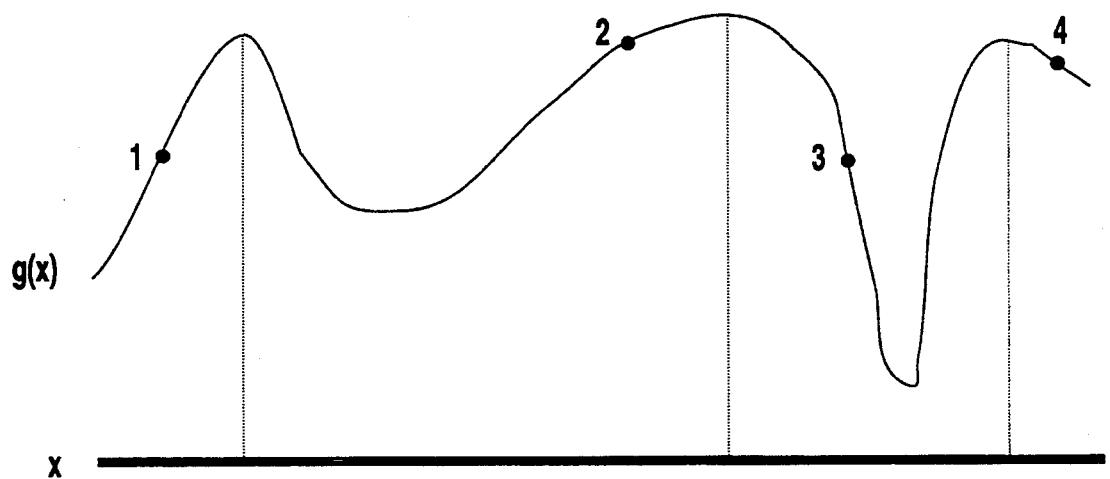
FIG. 11 is a single ..variable graph for illustrating the global optimization problem.

If something is known about the function, far fewer points may need to be evaluated to find the minimum. For example, FIG. 11 shows a function g(x), where x is the independent variable. If the location of the function's maxima are known (shown by the gray vertical lines), then only a few points are needed (one per interval between maxima). Still, each point must be used as the starting point for an optimization, and the local minima found. Then, each minimum is compared to find the global minimum.

The present invention associates a particular x value (i.e., "model parameter") with the function g(x) (i.e. "model behavior"). An ANN is used to associate a particular x value (e.g., the x value of point 3 in FIG. 11) with the function g(x), where the particular value is one which is known to converge to the global minimum. That is, a local optimization performed on the function g (x) starting at point 3 will converge to the global minimum between points 3 and 4. Design synthesis and modeling problems are subsets of the more general global optimization problem. That is, the present invention provides an efficient global optimization technique which uses an ANN to build an inverse model of a system. Given a model parameter, the inverse model computes an approximate model behavior. A local optimization technique derives a global minimum.

Figure 12:
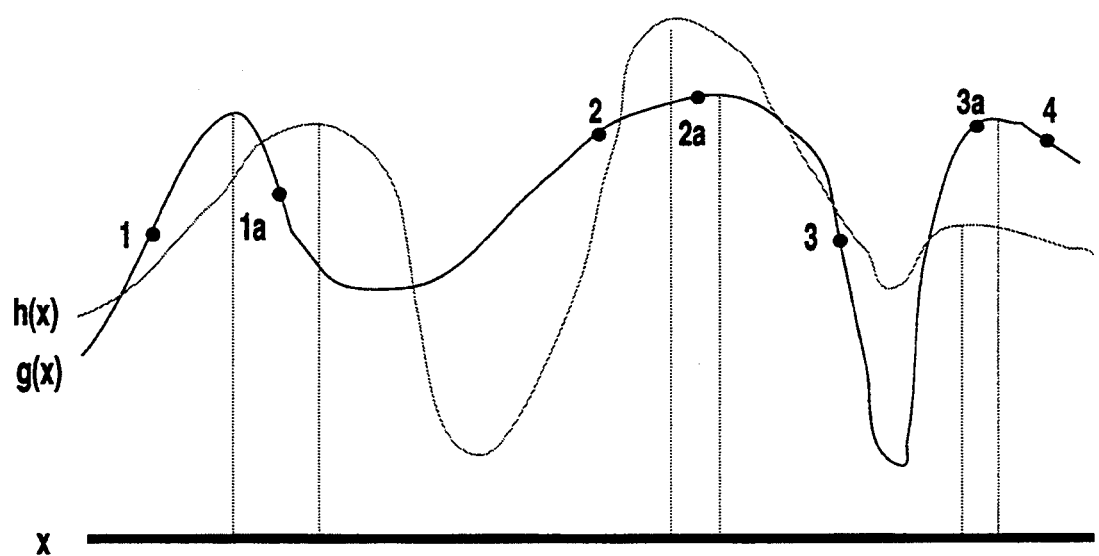
FIG. 12 is a graph of a multivariant function depicting the global optimization problem.

Now consider a function f(x,y). For a particular value of y (call it $y_{13}$ g), the function becomes g(x), a function of x only. For a different value of y, say y__h, the function f becomes h(x). These are one-dimensional "slices" through the two-dimensional function f(x,y), and are shown in FIG. 12. For each sampled value of y, a different point is associated by the ANN with the global minimum of f(x, y) at that y value. This process can be extrapolated to arbitrary dimension. Thus, a relatively small number of points can be stored with a well-characterized function, that, when combined with optimization techniques, will yield the global minimum of the function for given projections into lower dimensions (in this case, for different values of y).

The inverse mapping performed by the ANN does not have to be exact; only close enough for the traditional optimization techniques to converge. Once an initial guess for a mechanism has been obtained from the ANN, it may be "fine tuned" to the given problem through the use of optimization techniques. Since the problems are usually overconstrained, and there are behavioral regions that must be avoided, constrained optimization techniques ,are used. The preferred embodiment uses Levenberg-Marquardt optimization with constraints implemented as penalty functions. See U.S. Pat. No. 5,043,929 (Cols. 55–58).

4. Example

FIG. 2 describes the process for deriving optimal linkage parameters for a linkage mechanism which is schematically depicted in FIG. 3. As in the general process of FIG. 1, several subprocesses occur sequentially. In the example problem, the mechanical designer is faced with a four-bar linkage and desires a coupler curve as shown in FIG. 4 as the "desired behavior" of his mechanical system.

Turning to FIG. 2, the first subprocess develops a training set of examples for ANN learning. The linkage examples 40 are input to a forward modeler (linkage simulator) 42 which outputs coupler curves 44. As previously explained, each coupler curve can be represented by an infinite number of curvature plots, therefore the Fourier transform is performed at 46 to generate the power spectrum 48. See, FIGS. 4, 6, and 7.

The second subprocess utilizes the linkage examples 40 and the representations 48 for ANN learning 50 as a set of training examples. The result of the ANN learning is the inverse model 52. Preferably, one or more networks are used to build an inverse model for each type of linkage mechanism and the inverse models stored in computer memory for later use in design synthesis.

Figure 7:
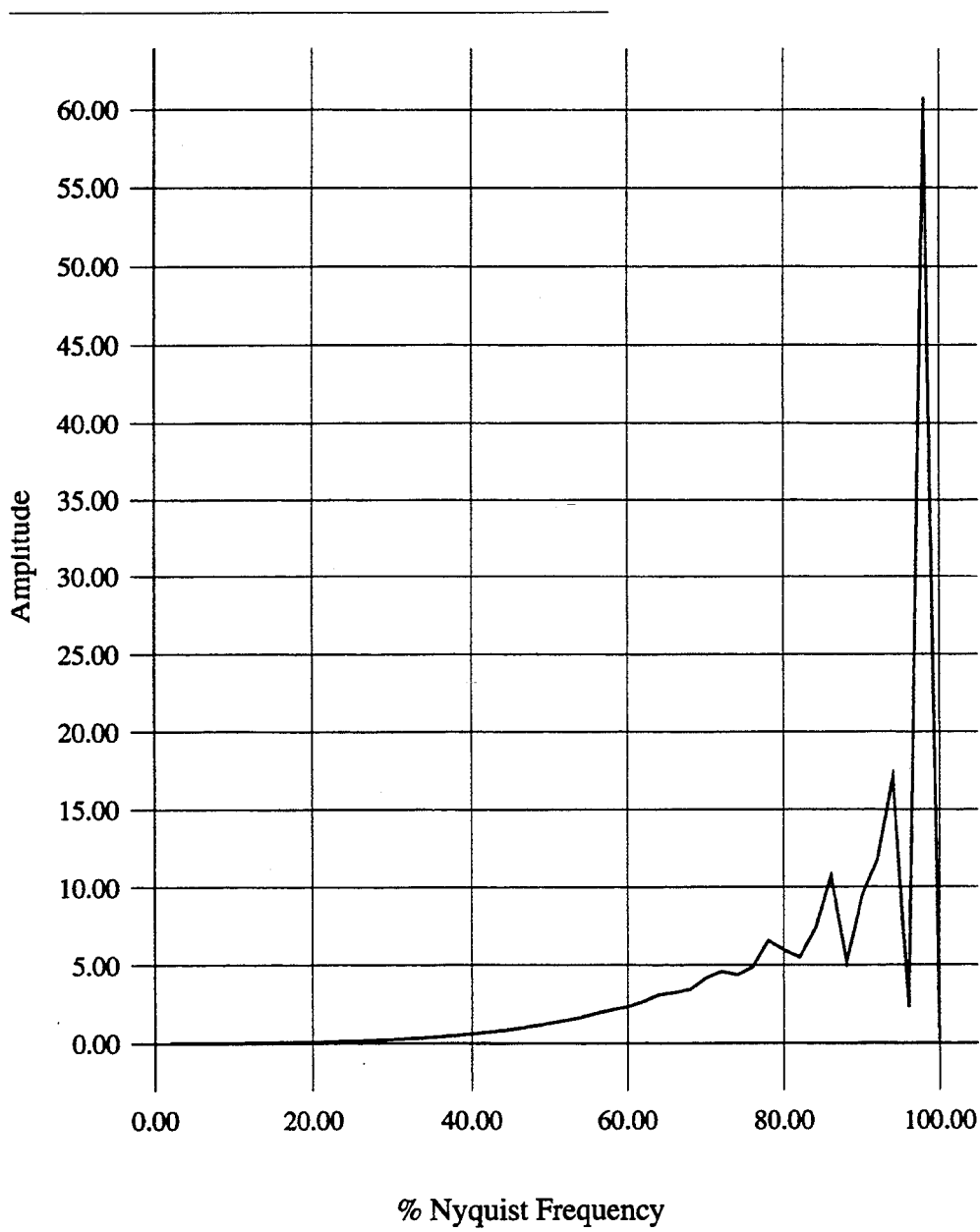
FIG. 7 is a representation of the plot of FIG. 6 showing the power spectrum.

In the example, the mechanical designer specifies a coupler curve at 56 and a representation of the coupler curve is created as at 58, 60 (FIGS. 4, 6, 7). The appropriate inverse model for the linkage system (here a four-bar linkage system) is recalled from memory as at 52. The power spectrum representation 60 is input to the inverse model 52 to generate the approximate linkage parameters 62.

The final subprocess takes the approximate linkage parameters 62 and utilizing a local optimization process 64 generates the optimal linkage parameters 68.

In more detail, the ANN must be trained as at 50 on a set of examples designed to span the space of "reasonable" designs of four-bar linkages. Using a small pan of the design space specifying crank & rocker linkages tests the hypothesis that ANNs in conjunction with optimization can be used to construct the inverse model needed in order to store and retrieve linkages. This example uses truncated ranges of two of the five linkage parameters, the crank length and one of the two parameters specifying the tracer point's location in the coupler's local coordinate frame, $v$. The crank length is investigated over the range [0.5, 0.8], sampled at an interval of 0.006. The range of $v$ is [0.4,0.4], sampled at an interval of 0.2258. The other linkage parameters are held constant. A training set consisting of 1750 examples was generated using an analytical forward model that takes a set of linkage parameters and produces a coupler curve from which the power spectrum is calculated. The analytical forward model is found in Hall, A. S. *Kinematics and Linkage Design*. Ball Publishers, West Lafayette, Ind. (1961). Republished by Wavelength Press, Prospect Heights, Ill. (1986), (incorporated for background). The RBF ANN contains 50 input nodes, each corresponding to one of the 50 sampled magnitude parameters in the power spectrum of a coupler curve. See, FIG. 5. No scaling or preprocessing is performed on the power spectrum data. The number of RBF nodes in the hidden layer is varied over the range from 50 nodes to 750 nodes. The output layer contains five nodes, one for each of the linkage parameters.

Figure 8:
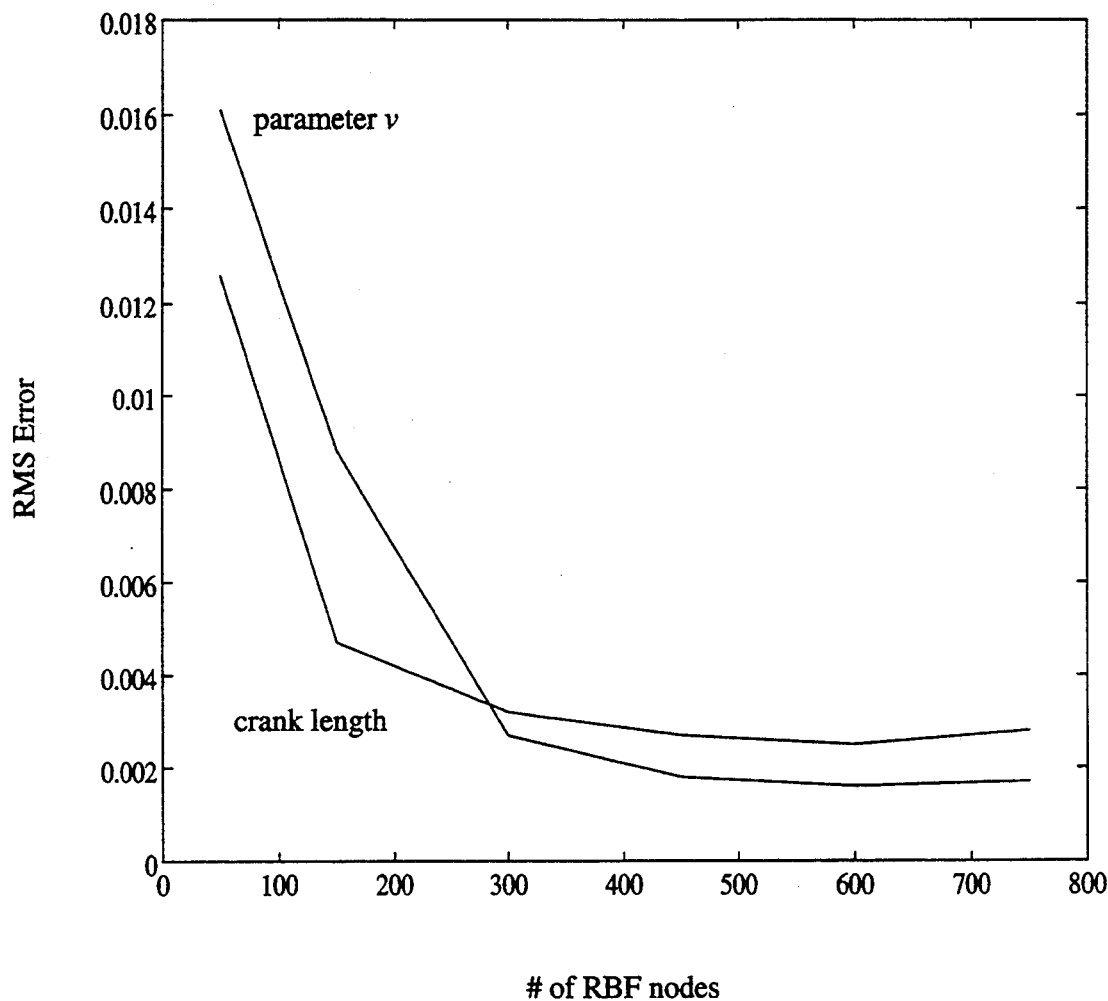
FIG. 8 is a graph of the root mean square error of the crank length and tracer point parameter and versus the number of RBF nodes.

The network is trained using the three-stage hybrid learning scheme previously outlined. The value of the overlap factor, $a$, is chosen to be 4.0. The number of RBF node is varied empirically to obtain the best approximate linkage parameters upon validation. FIG. 8 shows a plot of the RMS error of both predicted parameters as a function of the number of RBF nodes. The error of both the predicted crank length and the tracer point parameter varies inversely with the number of RBF nodes until the minimum error is reached at 600 RBF nodes.

Although a network containing 600 RBF nodes can be used to predict an approximate linkage mechanism from a user-specified curve with acceptable accuracy, a goal is to generate an inverse model that minimizes complexity and maximizes accuracy. If optimization is used to increase the accuracy of the approximation computed by the network, the task is to determine the minimum number of RBF nodes. Initial experiments using constrained Levenberg-Marquardt optimization yield a minimum complexity network containing 250 RBF nodes. A network containing fewer RBF nodes can produce predicted linkage parameters that when used as initial guesses for the optimizer can result in the optimization finding a sub-optimal local minima.

Figure 9:
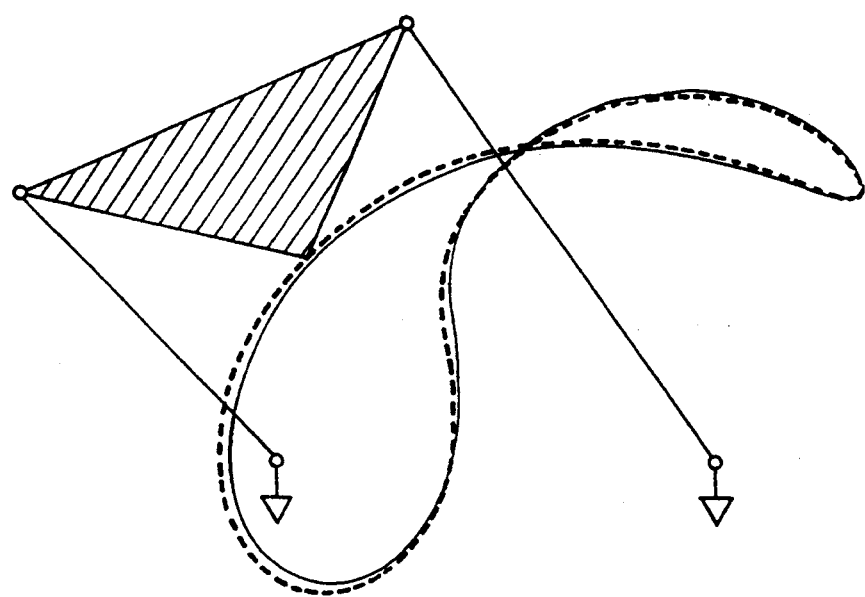
FIG. 9 is a schematic illustration of the RBF ANN prediction of a coupler curve using approximated linkage parameters for the four-bar linkage of FIG. 3.
Figure 10:
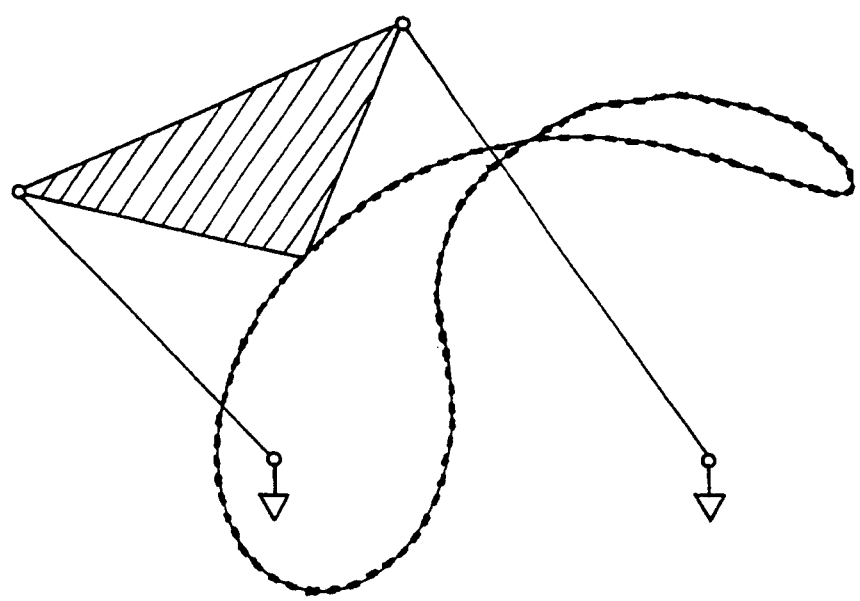
FIG. 10 is a depiction of a coupler curve for optimized linkage parameters of FIG. 9.

FIGS. 9 and 10 show the results of applying the above approach to the user-specified curve in FIG. 4. In FIG. 9 the power spectrum of the coupler curve is input into the RBF ANN yielding the predicted linkage parameters that produce the approximate coupler curve (thick dashed line). Subsequently, Levenberg-Marquardt optimization is used to produce the optimal linkage parameters that produce the desired coupler curve as shown in FIG. 10.

We claim:

1. A method of global optimization comprising the steps of:
   a. developing an approximate inverse model of a system using an artificial neural network (ANN), including the substeps
      constructing a forward model having inputs and outputs with model parameters as inputs and behaviors as outputs,
      building a set of training examples consisting of a set of model parameters and their corresponding behaviors as derived from the forward model,
      developing an ANN with said set of training examples to build an inverse model, said inverse model having inputs and outputs with behaviors as inputs and model parameters as outputs
      storing said inverse model;
   b. determining the approximate model parameters of a system given a desired behavior of the system as inputs including the substeps
      retrieving said inverse model, computing the approximate model parameters from said inverse model; and
   c. obtaining optimal model parameters for said system given the approximate model parameters including the substeps
      initializing a local optimization process with the approximate model parameters,
      optimizing said approximate model parameters using the forward model and the optimization process resulting in the optimal model parameters.

2. The method of claim 1, including the steps of:
   repeating step a. for multiple systems and storing said inverse model for each system in a computer memory,
   selecting, during said retrieving substep of step b. the inverse model in said memory corresponding to a specific system.

3. The method of claim 1, where said system includes constraints, the local optimization process is an iterative process with constraints of the system imposed as penalty functions.

4. The method of claim 3, where the local optimization process is a Levenberg-Marquardt type of optimization.

5. The method of claim 1, where a representation of the desired behavior as a function of space-time is input to the inverse model.

6. The method of claim 5, including the substep of transforming the representation to a function of frequency.

7. The method of claim 6, the representation comprising a Fourier transform.

8. The method of claim 1, said forward model comprising an artificial neural network.

9. The method of claim 1, where the system corresponds to a particular type of mechanical linkage and the optimal model parameters are linkage parameters including link dimensions.

10. The method of claim 1, the developing step a. further comprising:
    a. providing a number of examples of a type of linkage mechanism where each example includes linkage parameters and a representation of the linkage operation as a function of time;
    b. training said artificial neural network (ANN) using the linkage examples to build said inverse model of the mechanism which uses representation as input and linkage parameters as output;
    the determining step b. further comprising:
    c. inputting a representation of the desired behavior of the linkage mechanism to the inverse model; and d. computing approximate linkage parameters from said inverse model.

11. The method of claim 10, including the step of optimizing the approximate linkage parameters to derive optimal linkage parameters.

12. The method of claim 10, including the steps of:
repeating steps a and b for a plurality of types of linkage mechanisms;
storing the corresponding inverse model for each type; and
determining the type of said linkage mechanism and retrieving the corresponding inverse model for use in step c.

13. The method of claim 10, where said linkage operation is a function of space-time, including the substep of transforming the representation to the frequency domain.

14. The method of claim 10, said providing step a. including the substeps for deriving said representation comprising
describing as a coupler curve a path in space of a point on the linkage mechanism as the linkage mechanism is operated,
plotting the coupler curve as a cyclic plot of curvature versus length of curve perimeter, and
deriving a power spectrum of the plot.

15. The method of claim 10, said providing step a. including the substep of constructing a forward model which uses linkage parameters as inputs and a representation of linkage dynamics to build training set examples.

* * * * *